US006836144B1

(12) United States Patent
Bui et al.

(10) Patent No.: US 6,836,144 B1
(45) Date of Patent: Dec. 28, 2004

(54) PROGRAMMABLE SERIES ON-CHIP TERMINATION IMPEDANCE AND IMPEDANCE MATCHING

(75) Inventors: John Henry Bui, San Jose, CA (US); John Costello, Los Altos, CA (US); Stephanie Tran, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/206,250

(22) Filed: Jul. 26, 2002

Related U.S. Application Data (60) Provisional application No. 60/339,588, filed on Dec. 10, 2001.

(51) Int. Cl.[7] .................................................. H03K 5/12
(52) U.S. Cl. .......................... 326/32; 326/30; 326/26; 326/27; 327/108; 327/170; 327/112
(58) Field of Search ............................. 326/26, 27, 30, 326/32, 56–58, 86, 90; 327/108, 109, 170, 391

(56) References Cited

U.S. PATENT DOCUMENTS

| | | | |
|---|---|---|---|
| 4,719,369 A | | 1/1988 | Asano et al. |
| 4,954,729 A | * | 9/1990 | Urai ............................ 326/27 |
| 5,111,081 A | * | 5/1992 | Atallah ........................ 326/32 |
| 5,134,311 A | | 7/1992 | Biber et al. |
| 5,164,663 A | | 11/1992 | Alcorn |

(List continued on next page.)

OTHER PUBLICATIONS

Bendak, M. et al. (1996). "CMOS VLSI Implementation of Gigabyte/second computer network links," Dept. of Electrical and Computer Engineering, University of California at San Diego, La Jolla, CA 92093–0407, *IEEE International Symposium on Circuits and Systems* pp. 269–272.
Boni, A. et al. (2001). "LVDS I/O Interface for Gb/s–per–Pin Operation in 0.35–um CMOS," IEEE Journal of Solid–State Circuits, 36(4):706–711.
ALTERA, Apex 20K "Programmable Logic Device Family," Altera Corporation, Ver. 1.1, May 2001.
ALTERA, Apex II "Programmable Logic Device Family," Altera Corporation, Ver. 1.1, May 2001.
Esch and Manley, Theory and Design of CMOS HSTL I/O Pads, The Hewlett Packard Journal, Aug. 1998.
XILINX, "Virtex–II 1.5V Field Programmable Gate Arrays," Xilinx, DSO3102 (v1.5), Apr. 2, 2001.
Xilinx, "Spartan–3 1.2V FPGA Family: Functional Description," Xilinx, DS099–2 (v1.2) Jul. 11, 2003.
Xilinx, "Virtex–II Platform FPGAs: Detailed Description," Xilinx, DS031–2 (v3.1) Oct. 14, 2003.
Xilinx, "Virtex–II Pro Platform FPGAs: Functional Description," Xilinx, DS083–2 (v2.9) Oct. 14, 2003.

*Primary Examiner*—Vibol Tan
(74) *Attorney, Agent, or Firm*—Townsend and Townsend and Crew LLP; Steven J. Cahill (57) ABSTRACT

Circuits may provide series on-chip termination impedance to one or more input/output pins. In one embodiment, two off-chip reference resistors in combination with internal calibration circuitry are used to control termination transistors coupled to several input/output (I/O) pins. The termination transistors behave as programmably adjustable termination resistors that match the impedance of external resistors. By using only a small number of reference resistors (e.g., 2 resistors) for a large number of I/O pins, the present invention eliminates the external components that would otherwise be needed to provide resistance termination. The effective series termination resistance may be programmed, enabling the termination resistance to meet different I/O standards. Further, the resistance termination techniques of the present invention are not sensitive to process, voltage supply, and temperature (PVT) variations.

30 Claims, 3 Drawing Sheets

U.S. PATENT DOCUMENTS

| | | | |
|---|---|---|---|
| 5,179,300 A | * 1/1993 | Rolandi et al. | 326/83 |
| 5,359,235 A | 10/1994 | Coyle et al. | |
| 5,374,861 A | 12/1994 | Kubista | |
| 5,592,510 A | 1/1997 | Van Brunt et al. | |
| 5,602,494 A | 2/1997 | Sundstrom | |
| 5,623,216 A | * 4/1997 | Penza et al. | 326/27 |
| 5,726,582 A | 3/1998 | Hedberg | |
| 5,726,583 A | 3/1998 | Kaplinsky | |
| 5,764,080 A | 6/1998 | Huang et al. | |
| 5,864,715 A | 1/1999 | Zani et al. | |
| 5,939,896 A | 8/1999 | Hedberg | |
| 5,955,911 A | 9/1999 | Drost et al. | |
| 5,970,255 A | 10/1999 | Tran et al. | |
| 6,008,665 A | 12/1999 | Kalb et al. | |
| 6,026,456 A | 2/2000 | Ilkbahar | |
| 6,037,798 A | 3/2000 | Hedberg | |
| 6,049,255 A | 4/2000 | Hagberg et al. | |
| 6,064,224 A | 5/2000 | Esch, Jr. et al. | |
| 6,087,847 A | 7/2000 | Mooney et al. | |
| 6,097,208 A | 8/2000 | Okajima et al. | |
| 6,100,713 A | 8/2000 | Kalb et al. | |
| 6,118,310 A | 9/2000 | Esch, Jr. | |
| 6,147,520 A | 11/2000 | Kothandaraman et al. | |
| 6,154,060 A | 11/2000 | Morriss | |
| 6,157,206 A | 12/2000 | Taylor et al. | |
| 6,181,157 B1 | 1/2001 | Fiedler | |
| 6,236,231 B1 | 5/2001 | Nguyen et al. | |
| 6,252,419 B1 | 6/2001 | Sung et al. | |
| 6,329,836 B1 | 12/2001 | Drost et al. | |
| 6,356,106 B1 | 3/2002 | Greeff et al. | |
| 6,362,644 B1 | 3/2002 | Jeffery et al. | |
| 6,366,128 B1 | 4/2002 | Ghia et al. | |
| 6,411,126 B1 | 6/2002 | Tinsley et al. | |
| 6,414,512 B1 | 7/2002 | Moyer | |
| 6,424,169 B1 | 7/2002 | Partow et al. | |
| 6,433,579 B1 | 8/2002 | Wang et al. | |
| 6,445,245 B1 | 9/2002 | Schultz et al. | |
| 6,448,813 B2 | 9/2002 | Garlepp et al. | |
| 6,466,063 B2 | * 10/2002 | Chen | 327/112 |
| 6,489,837 B2 | 12/2002 | Schultz et al. | |
| 6,586,964 B1 | 7/2003 | Kent et al. | |
| 6,590,413 B1 | 7/2003 | Yang | |
| 6,603,329 B1 | 8/2003 | Wang et al. | |
| 6,639,397 B2 | 10/2003 | Roth et al. | |
| 6,642,741 B2 | 11/2003 | Metz et al. | |
| 6,683,482 B2 | * 1/2004 | Humphrey et al. | 327/170 |
| 2002/0010853 A1 | 1/2002 | Trimberger et al. | |
| 2002/0060602 A1 | 5/2002 | Ghia et al. | |
| 2002/0101278 A1 | 8/2002 | Schultz et al. | |
| 2003/0062922 A1 | 4/2003 | Douglass et al. | |
| 2004/0008054 A1 | 1/2004 | Lesea et al. | |

* cited by examiner

PROGRAMMABLE SERIES ON-CHIP TERMINATION IMPEDANCE AND IMPEDANCE MATCHING

CROSS-REFERENCES TO RELATED APPLICATIONS

This application claims the benefit of U.S. Provisional Patent Application 60/339,588 filed on Dec. 10, 2001, which is incorporated by reference herein.

BACKGROUND OF THE INVENTION

The present invention relates in general to integrated circuitry and in particular to method and circuitry for implementing programmable on-chip termination impedance.

To minimize signal reflection that causes signal distortion and degrades overall signal quality, transmission lines are resistively terminated. In the case of integrated circuits that are in communication with other circuitry on a circuit board, termination is often accomplished by coupling an external termination resistor to the relevant input/output (I/O) pins. The use of external components for termination purposes can be cumbersome and costly, especially in the case of an integrated circuit with numerous I/O pins.

A termination resistor is typically coupled to every I/O pin receiving input on a transmission line. Often hundreds of termination resistors are needed for an integrated circuit. Numerous external termination resistors can consume a substantial amount of board space.

It is therefore desirable to provide on-chip termination resistance to eliminate external components. It is further desirable to make on-chip termination resistance insensitive to process, voltage supply, and temperature variations of an integrated circuit.

BRIEF SUMMARY OF THE INVENTION

The present invention provides various embodiments for efficient, flexible and cost-effective implementations of series on-chip termination impedance (e.g., resistance). In one embodiment, the invention comprises an integrated circuit with two off-chip reference resistors and internal calibration circuitry. The calibration circuitry controls termination transistors coupled to input/output (I/O) pins of the integrated circuit. The termination transistors behave as programmably adjustable termination resistors that match the impedance of the external reference resistors.

By using only a small number of reference resistors (e.g., 2 resistors) for a large number of I/O pins, the present invention eliminates the external components otherwise needed to provide termination impedance. In the present invention, the effective series termination impedance may be programmed, enabling the termination impedance to meet different I/O standards. Further, the termination impedance techniques of the present invention are not sensitive to process, voltage supply, and temperature (PVT) variations of the integrated circuit.

DETAILED DESCRIPTION OF THE INVENTION

Figure 1:
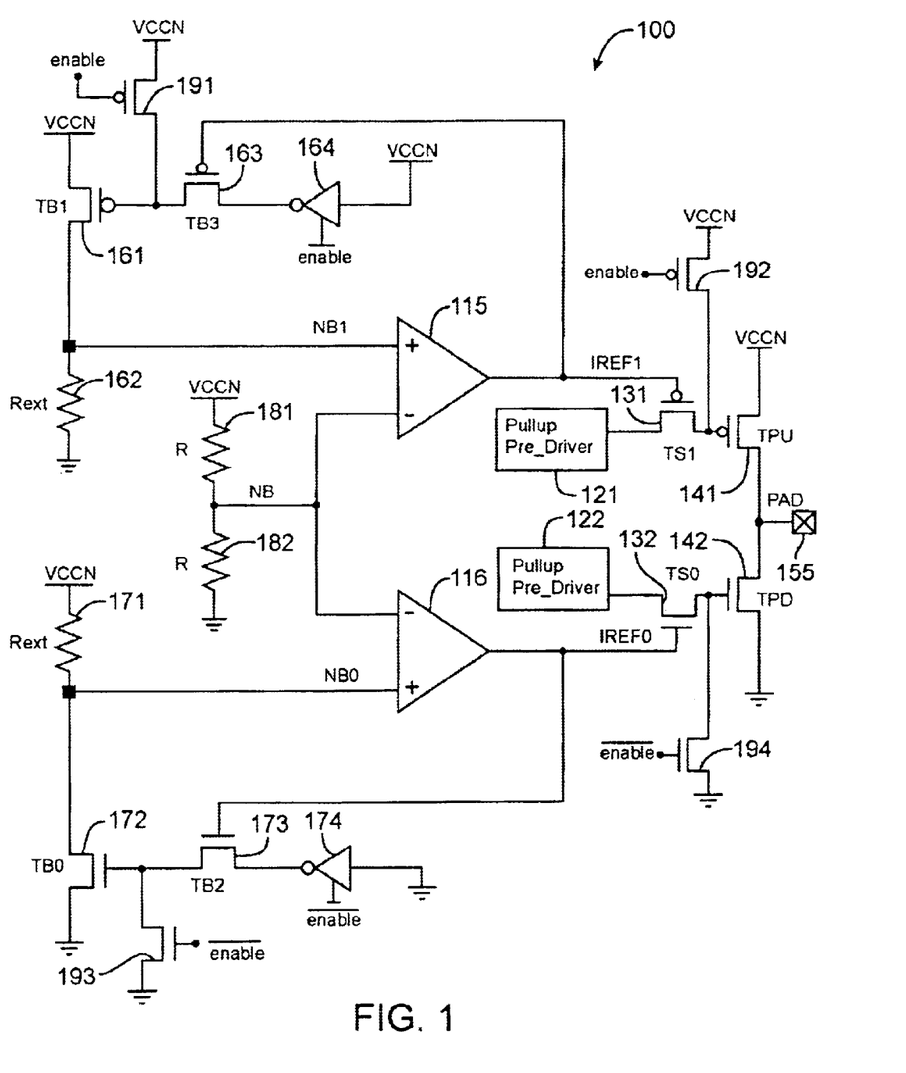
FIG. 1 is a simplified diagram of a programmable circuit that provides termination impedance, according to an embodiment of the present invention.

FIG. 1 illustrates circuit 100, which is an embodiment of the present invention. Circuit 100 provides series on-chip termination impedance to transmission lines that are coupled to input/output (I/O) pin 155. Circuit 100 controls the series termination impedance provided to I/O pin 155 by controlling the impedance of transistors 141 and 142.

Circuit 100 controls the impedance (i.e., the drain-source resistance $R_{DS(ON)}$) of pull up transistor 141 and pull down transistor 142. Transistors 141 and 142 provide on-chip termination resistance at input/output (I/O) pin 155 in accordance with the principles of the present invention.

Circuit 100 includes components that are part of an integrated circuit and components that are not part of the integrated circuit. External resistors 162 and 171 are not part of the integrated circuit (i.e., off-chip components). High gain operational amplifiers 115–116, inverters 164 and 174, resistors 181–182, pre-drivers 121–122, and field-effect transistors 161, 172, 131–132, 141–142, 163, 173, and 191–194 are part of the integrated circuit (on-chip components). The channel W/L ratios of transistors within drivers 164 and 174 are proportional to the channel W/L ratios of transistors within drivers 121 and 122, respectively.

Also, the channel W/L ratios of transistors 161 and 172 are proportional to the channel W/L ratios of transistors 141 and 142, respectively. The channel W/L ratios of transistors 163 and 173 are proportional to the channel W/L ratios of transistors 131 and 132, respectively. The channel W/L ratios of transistors 191 and 193 are proportional to the channel W/L ratios of transistors 192 and 194, respectively.

Circuit 100 can drive the voltage at I/O pin (i.e., pad) 155 to the supply voltage $V_{CCN}$ (a HIGH state) or to ground (a LOW state) so that digital data can be transmitted externally. Control circuitry (not shown) within the integrated circuit controls the activity of pull-up pre-driver 121 and pull-down pre-driver 122. The control circuitry can cause pre-drivers 121 and 122 to drive pin 155 to $V_{CCN}$ by turning ON transistor 141 and turning OFF transistor 142. The control circuitry can also cause pre-drivers 121 and 122 to drive pin 155 to ground by turning OFF transistor 141 and turning ON transistor 142.

When pin 155 is pulled HIGH, transistor 141 provides termination impedance (resistance) to the transmission line coupled to pin 155. When pin 155 is pulled LOW, transistor 142 provides termination impedance (resistance) to the transmission line coupled to pin 155.

Circuit 100 sets the drain-source resistance $R_{DS(ON)}$ of transistors 141–142 so that the $R_{DS(ON)}$ of transistors 141/142 match the impedance of the transmission line coupled to pin 155. Proper impedance matching at pin 155 prevents signal reflection that can cause signal distortion. Circuit 100 is discussed in further detail below.

Pull-up driver 121 can pull pin 155 up to supply voltage $V_{CCN}$ by pulling the gate terminal of p-channel transistor 141 to ground through p-channel transistor 131. When the gate of p-channel transistor 141 is grounded by pre-driver 121, transistor 141 is ON. The voltage at pin 155 is pulled to $V_{CCN}$ through transistor 141, if transistor 142 is OFF. Pull down pre-driver 122 turns n-channel transistor 142 OFF by allowing n-charnel transistor 194 to pull the gate of transistor 142 to ground.

Transistor 194 has a source coupled to ground and a gate coupled to an enable bar signal. Enable bar is HIGH during normal operation causing transistor 194 to be ON. Transistor 194 has a small channel width-to-length ratio. Therefore, transistor only conducts a relatively small amount of charge away from the gate of transistor 142 (e.g., sub-micron current) compared to the charge that can be supplied by pre-driver 122.

Pull-down driver 122 can pull pin 155 down to ground by pulling the gate of terminal of n-channel transistor 142 to $V_{CCN}$ through n-channel transistor 132. When the gate of n-channel transistor 142 is pulled to $V_{CCN}$ by pre-driver 122, transistor 142 is ON. The voltage at pin 155 is pulled to ground through transistor 142, if transistor 141 is OFF. Pull-up pre-driver 121 turns p-channel transistor 141 OFF by allowing p-channel transistor 192 to pull the gate of transistor 141 to $V_{CCN}$.

Transistor 192 has a source coupled to the supply voltage $V_{CCN}$, and a gate coupled to an enable signal. The enable signal is LOW during normal operation causing transistor 192 to be ON. The enable bar signal is the inverse of the enable signal. The enable and enable bar signals cause circuitry (including transistors 191–194) within impedance matching circuit 100 to be enabled or disabled. A user may want to disable circuit 100 to use external impedance matching resistors.

Transistor 192 has a small channel width-to-length ratio. Transistor 192 provides a relatively small amount of charge to the gate of transistor 141 compared to the charge that can be drawn by pre-driver 121 (e.g., sub-micron current).

Circuit 100 controls the impedance of transistor 141 as will now be discussed in detail. A user of the integrated circuit can select off-chip resistors 162 and 171 to control the termination resistance of transistor 141. Circuit 100 monitors the resistance of resistor 162 and adjusts the $R_{DS(ON)}$ of transistor 141 so that it equals the resistance of resistor 162. Circuit 100 also monitors the resistance of resistor 171 and adjusts the $R_{DS(ON)}$ of transistor 142 so that it equals the resistance of resistor 171. Resistors 162 and 171 should be selected so that their impedance matches the impedance of the transmission line coupled to pin 155.

For example, if the transmission line coupled to pin 155 has an impedance of 50 ohms, a user should select resistors 162 and 171 that have a resistance of 50 ohms. Circuit 100 monitors resistors 162 and 171 and adjusts the $R_{DS(ON)}$ of transistors 141 and 142 to equal 50 ohms. One skilled in the art will understand that the specific components values of circuit 100 can be selected so that the $R_{DS(ON)}$ of transistor 141 equals resistor 162 and the $R_{DS(ON)}$ of transistor 142 equals resistor 171.

Resistors 181 and 182 in circuit 100 form a voltage divider coupled been supply voltage $V_{CCN}$ and ground. The voltage divider provides a reference voltage to the inverting inputs of high-gain operational amplifiers 115 and 116. If resistors 181 and 182, for example, have an equal resistance value, then the voltage provided at the inverting inputs of amplifiers 115 and 116 is one-half of supply voltage $V_{CCN}$, regardless of PVT variations.

Current flows through p-channel transistor 161 and external resistor 162 between $V_{CCN}$ and ground. Transistor 161 and resistor 162 provide a voltage (NB1) at the non-inverting input of amplifier 115. Voltage NB1 is proportional to the resistance of resistor 162. Voltage NB1 is inversely proportional to the $R_{DS(ON)}$ of transistor 161.

Current also flows through external resistor 171 and n-channel transistor 172 between $V_{CCN}$ and ground. Transistor 172 and resistor 171 provide a voltage (NB0) at the non-inverting input of amplifier 116. Voltage NB0 is inversely proportional to the resistance of resistor 171. Voltage NB1 is proportional to the $R_{DS(ON)}$ of transistor 172.

If the user changes the resistance of external resistor 162, circuit 100 adjusts the $R_{DS(ON)}$ of transistor 141 to match resistor 162. For example, if a user replaces a 50 ohm resistor 162 with a 55 ohm resistor 162, input voltage NB1 increases. High gain operational amplifier 115 responds by increasing output voltage IREF1. Less current flows through p-channel transistor 131 to ground through pre-driver 121, and the gate voltage of transistor 141 is pulled higher by p-channel transistor 192. The $I_{DS}$ current through p-channel transistor 141 decreases, and the $R_{DS(ON)}$ of transistor 141 increases from 50 ohms to 55 ohms.

If the user changes the resistance of external resistor 171, circuit 100 adjusts the $R_{DS(ON)}$ of transistor 142 to match resistor 171. If a user replaces a 50 ohm resistor 171 with a ohm resistor 171, input voltage NB0 increases. High gain amplifier 115 responds by increasing output voltage IREF0. More current flows through transistor 132 from driver 122 to the gate of transistor 142. The $I_{DS}$ current through transistor 142 increases, and the $R_{DS(ON)}$ of transistor 142 decreases from 50 ohms to 45 ohms.

Once the termination resistance for pin 155 has been selected, circuit 100 maintains the impedance of transistors 141 and 142 substantially constant. The $R_{DS(ON)}$ of transistor 141 is maintained at the resistance of resistor 162, and the $R_{DS(ON)}$ of transistor 142 is maintained at the resistance of resistor 171.

However, the $R_{DS(ON)}$ of field effect transistors can vary in response to PVT variations on the circuit. Circuit 100 causes the impedance of transistors 141 and 142 to be insensitive PVT variations, as will now be discussed in detail.

The gate terminal of p-channel transistor 161 is coupled to the output of inverter circuit 164 through the channel of transistor 163. The input of inverter 164 is coupled to supply voltage $V_{CCN}$. Inverter 164 pulls the gate voltage of p-channel transistor 161 LOW through transistor 163. Inverter 164 provides current that maintains p-channel transistor 161 ON (if transistors in driver 164 are proportional to transistors in drivers 121). The enable signal causes inverter 164 to be OFF when enable is LOW.

P-channel transistor 191 is coupled between the gate of transistor 161 and supply voltage $V_{CCN}$. The gate of transistor 191 is coupled to the enable signal. The enable signal is LOW during normal operation causing transistor 191 to be ON. Transistor 191 has a small channel width-to-length ratio (e.g., a small channel width and a large channel length). Transistor only provides a relatively small amount of charge to the gate of transistor 161 (e.g., sub-micron current).

The gate terminals of p-channel transistors 163 and 131 are coupled to the output of amplifier 115. The output voltage (IREF1) of amplifier 115 equals the gate voltage of transistors 163 and 131. Amplifier 115 controls the drain-source current $I_{DS}$ and the drain-source resistance $R_{DS}$ of transistors 163 and 131 in response to the voltage differential across its input terminals.

Process, voltage supply, and temperature (PVT) variations in the integrated circuit can cause the drain-source ON resistance $R_{DS(ON)}$ of transistor 161 to change. When PVT variations cause the $R_{DS(ON)}$ of transistor 161 to increase slightly, voltage NB1 decreases. NB1 is a first signal that indicates the impedance of transistor 161.

Amplifier 115 responds to voltage NB1 by decreasing output voltage (IREF1). When the output voltage of amplifier 115 decreases, the current through transistor 163 increases. In response, the gate voltage of transistor 161 is pulled closer to ground (e.g., 0 volts) through transistor 163. The decreased gate voltage compensates for the increase in the $R_{DS(ON)}$ of transistor 161. The $R_{DS(ON)}$ of transistor 161 stabilizes as a result of the feedback loop comprising amplifier 115 and transistor 163.

In a similar fashion, amplifier 115 prevents the $R_{DS(ON)}$ of transistor 161 from decreasing by more than a small amount. When PVT variations cause the $R_{DS(ON)}$ of transistor 161 to decrease slightly, voltage NB1 increases. Amplifier 115 responds by increasing output voltage IREF1, causing the current through transistor 163 to decrease. The gate voltage of transistor 161 is pulled closer to supply voltage $V_{CCN}$ as a result the current provided by transistor 191. The increased gate voltage compensates for the decrease in the $R_{DS(ON)}$ of transistor 161. Therefore, amplifier 115 stabilizes the $R_{DS(ON)}$ of transistor 161.

Amplifier 115 and transistor 163 provide a feedback loop around transistor 161 that compensates for changes in the $R_{DS(ON)}$ of transistor 161 caused by PVT variations. Amplifier 115 prevents the $R_{DS(ON)}$ of transistor 161 from increasing or decreasing by more than a small amount.

Amplifier 115 also adjusts the current through transistor 131 at the same time that it adjusts the current through transistor 163. Process, voltage supply, and temperature (PVT) variations also cause the $R_{DS(ON)}$ of transistors 141 and 142 to change. When PVT variations cause the $R_{DS(ON)}$ of transistor 161 to increase slightly, the $R_{DS(ON)}$ of transistor 141 also increases slightly.

Amplifier 115 compensates for the increase in $R_{DS(ON)}$ of transistor 141 by causing the gate voltage of transistor 141 to decrease. When the $R_{DS(ON)}$ of transistor 161 increases, voltage IREF1 decreases. In response, the current through transistor 131 increases, and pre-driver 121 pulls the gate voltage of transistor 141 closer to ground. The $R_{DS(ON)}$ of transistor 141 decreases slightly to compensate for the increase in $R_{DS(ON)}$ caused by PVT variations. The $R_{DS(ON)}$ of transistor 141 may remain substantially constant despite PVT variations.

PVT variations can also cause the $R_{DS(ON)}$ of transistor 161 and transistor 141 to decrease slightly. In this situation, amplifier 115 compensates for the drop in $R_{DS(ON)}$ of transistor 141 by causing the gate voltage of transistor 141 to increase.

When the $R_{DS(ON)}$ of transistor 161 decreases, voltages NB1 and IREF1 increase. In response, the current through transistor 131 decreases, and the gate voltage of transistor 141 is pulled closer to supply voltage $V_{CCN}$ through transistor 192. The $R_{DS(ON)}$ of transistor 141 increases slightly to compensate for the decrease in $R_{DS(ON)}$ caused by PVT variations. The $R_{DS(ON)}$ of transistor 141 may remain substantially constant despite PVT variations.

Amplifier 115 varies the gate voltage of transistor 141 in order reduce changes in the $R_{DS(ON)}$ of transistor 141 caused by PVT variations. Therefore, the termination resistance provided by transistor 141 to pin 155 is not sensitive to PVT variations.

Circuit 100 also controls the impedance of transistors 172 and 142 as will now be discussed in detail. The gate terminal of n-channel transistor 172 is coupled to the output of inverter circuit 174 through the channel of transistor 173. The input of inverter 174 is coupled to ground. Inverter 174 pulls the gate voltage of n-channel transistor 172 to a higher voltage through n-channel transistor 173. Inverter 174 provides current to maintain n-channel transistor 172 ON.

N-channel transistor 193 is coupled between the gate of transistor 172 and ground. Transistor 193 has a gate coupled to the enable bar signal. The enable bar signal is HIGH during normal operation causing transistor 193 to be ON.

Transistor 193 has a small channel width-to-length ratio. Transistor 193 conducts a relatively small amount of charge away from the gate of transistor 172 to ground (e.g., sub-micron current).

The gate terminals of n-channel transistors 173 and 132 are coupled to the output of amplifier 116. Amplifier 116 controls the drain-source current and the drain-source resistance $R_{DS(ON)}$ of transistors 173 and 132 in response to the voltage differential across its input terminals.

Process, voltage supply, and temperature (PVT) variations in the integrated circuit can cause the drain-source resistance $R_{DS(ON)}$ of transistor 172 to change. When PVT variations cause the $R_{DS(ON)}$ of transistor 172 to increase slightly, voltage NB0 increases. NB0 is a second signal that indicates the impedance of transistor 172. Amplifier 116 responds by increasing output voltage (IREF0). When the output voltage of amplifier 115 increases, the current through n-channel transistor 173 increases.

In response, the gate voltage of transistor 172 is pulled closer to $V_{CCN}$ (at the output of inverter 174) through transistor 173. The increased gate voltage compensates for the increase in the $R_{DS(ON)}$ of transistor 172. Thus, amplifier 116 prevents the $R_{DS(ON)}$ of transistor 172 from increasing by more than a small amount.

In a similar fashion, amplifier 116 prevents the $R_{DS(ON)}$ of transistor 172 from decreasing by more than a small amount. When PVT variations cause the $R_{DS(ON)}$ Of transistor 172 to decrease slightly, voltage NB0 decreases. Amplifier 116 responds by decreasing output voltage IREF0, causing the current through transistor 173 to decrease. The gate voltage of transistor 172 is pulled closer to ground as a result the small current provided by transistor 193.

Amplifier 116 stabilizes the $R_{DS(ON)}$ of transistor 172. Amplifier 116 and transistor 173 provide a feedback loop around transistor 172 that compensates for changes in the $R_{DS(ON)}$ of transistor 172 caused by PVT variations. Amplifier 116 prevents the $R_{DS(ON)}$ of transistor 172 from increasing or decreasing by more than a small amount.

Circuit 100 also controls the impedance of transistor 142 as will now be discussed in detail. Process, voltage supply, and temperature (PVT) variations can cause the $R_{DS(ON)}$ of transistors 172 and 142 to increase at the same time. When the $R_{DS(ON)}$ of transistor 172 increases slightly, less current flows through transistor 172, and voltage NB0 at the non-inverting input of amplifier 116 increases. In response, amplifier 116 increases output voltage IREF0. Amplifier 116 adjusts the current through transistor 132 at the same time that it adjusts the current through transistor 173.

The current through n-channel transistor 132 increases in response to the increase in IREF0. More current flows from pre-driver 122 to the gate of n-channel transistor 142, and the gate-source voltage of transistor 142 increases. Amplifier 116 reduces the $R_{DS(ON)}$ of transistor 142 to cancel out the increase in $R_{DS(ON)}$ caused by the PVT variations.

Similarly, when $R_{DS(ON)}$ of transistor 172 decreases slightly in response to PVT variations, more current flows through transistor 172, and voltage NB0 at the non-inverting input of amplifier 116 decreases. In response, amplifier 116 decreases output voltage IREF0.

The current through n-channel transistor 132 decreases, and the gate-source voltage of n-channel transistor 142 is pulled closer to ground through transistor 194. Amplifier 116 increases the $R_{DS(ON)}$ of transistor 142 to cancel out the decrease in $R_{DS(ON)}$ caused PVT variations.

Therefore, circuit 100 makes the $R_{DS(ON)}$ of transistor 142 insensitive to process, voltage supply, and temperature (PVT) variations. Circuit 100 can maintain the $R_{DS(ON)}$ of transistor 142 substantially constant by compensating for PVT variations. Termination transistors 141 and 142 behave as programmably adjustable termination resistors that match the impedance of external resistors 162 and 171, respectively. The effective series termination impedance may be programmed by changing the resistance of resistors 162 and 171, enabling the termination impedance to meet different I/O standards.

Figure 2:
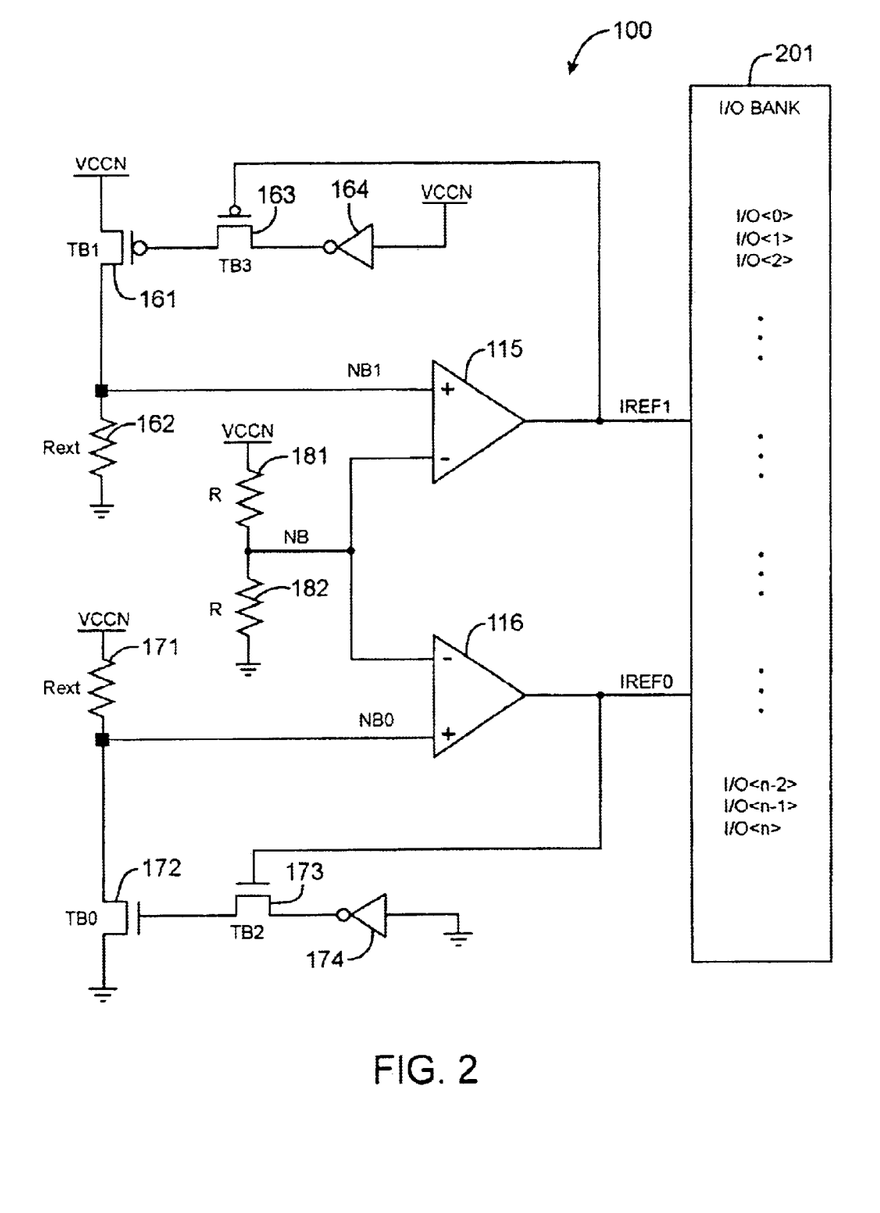
FIG. 2 shows an implementation of a programmable circuit that provides termination impedance for an I/O bank, according to another embodiment of the present invention.

In a further embodiment of the present invention, amplifiers 115 and 116 can be coupled to two or more input/output pins in I/O bank 201 on an integrated circuit as shown in FIG. 2. Signals IREF1 and IREF0 may control the impedance of pull up and pull down transistors that provide termination impedance for numerous I/O pins in I/O bank 201.

By using only a small number of reference resistors (e.g., 2 resistors) for a large number of I/O pins, the present invention eliminates the external components that provide series termination impedance to I/O pins on an integrated circuit. For example, only two external resistors 162 and 171 may be needed to indicate the termination resistance for several dozen or even several hundred I/O pins in I/O bank 201.

Figure 3:
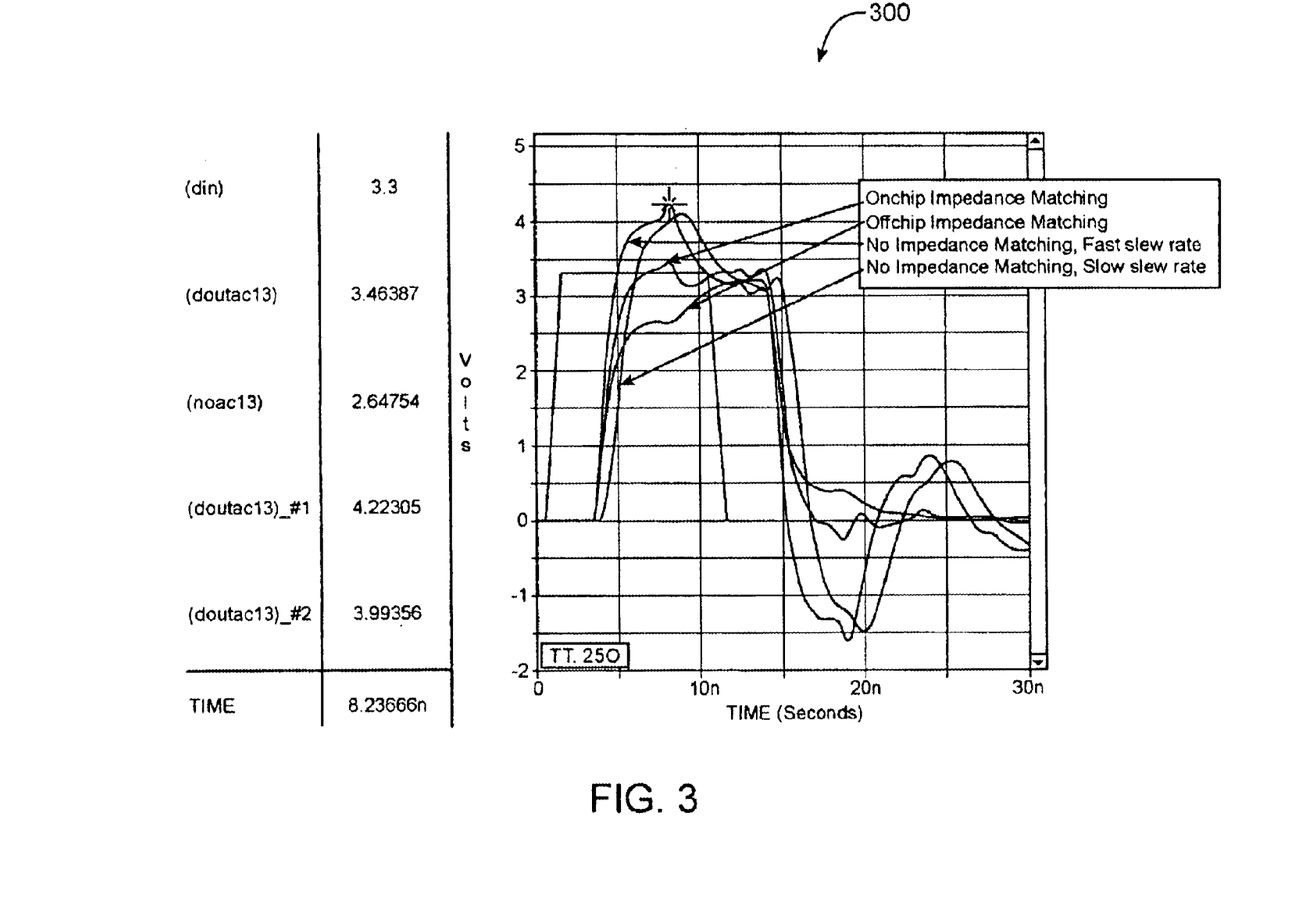
FIG. 3 shows simulation results comparing the output waveforms of a driver with on-chip impedance matching, according to an embodiment of the present invention, to various other implementations.

FIG. 3 illustrates a graph of voltage signals at a characteristic I/O pin coupled to a transmission line. Impedance termination is provided to the I/O pin. Referring to FIG. 3, the pull up transistor initially attempts to pull the voltage at the I/O pin up to supply voltage 3.3 volts. In a circuit with no impedance matching, the voltage on the pin overshoots the supply voltage. For example, the pin voltage rises to about 4.0–4.2 volts, for a fast slew rate and a slow slew rate. In a circuit with off-chip impedance matching, the pin voltage initially undershoots the supply voltage (e.g., about 2.6 volts).

In a circuit with on chip impedance matching in accordance with the present invention, the pin voltage comes the closest to the supply voltage as shown in FIG. 3. The pin voltage may overshoot the supply only slightly (e.g., 3.48 volts).

Subsequently, the pull down transistor attempts to pull the pin voltage down to ground. In a circuit with no impedance matching, the pin voltage initially undershoots ground and then overshoots ground before it settles. For example, the pin voltage may initially drop to −1.5. volts and then oscillate. The undershooting and overshoot voltage effects are highly undesirable.

In a circuit with off-chip impedance matching, the pin voltage takes longer to reach ground than in a circuit with the on-chip impedance matching of the present invention. In a circuit with the on-chip impedance matching of the present invention, the voltage on the pin may oscillate slightly around ground before it settles at zero volts.

The on-chip impedance termination circuitry of the present invention can be disabled so that external termination resistors can be used by causing the enable signal to go HIGH and the enable bar signal to go LOW. When enable is HIGH and enable bar is LOW, inverters 164 and 174 are OFF. The output of inverter 164 is HIGH causing transistor 161 to be OFF, and the output of inverter 174 is LOW causing transistor 172 to be OFF. Also, when enable goes HIGH and enable bar goes LOW.

Amplifiers 115 and 116 may have enable inputs that are coupled to the enable or enable bar signals. Amplifiers 115 and 116 are enabled when the enable signal goes LOW, and are disabled when the enable signal goes HIGH. When the amplifiers are OFF, current continues to be supplied to the gates of transistors 131 and 132 through pass transistors that are not shown in FIGS. 1–2. Therefore, transistors 131 and 132 remain ON during disable mode so that drivers 121 and 122 can still turn transistors 141 and 142ON.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit comprising:
    a first pull up transistor that provides series termination impedance to an input/output pin;
    a second pull down transistor that provides series termination impedance to the input/output pin;
    a first feedback loop circuit coupled to a first resistor that matches the impedance of the first pull up transistor with an impedance of the first resistor and that compensates for changes in the impedance of the first pull up transistor that am caused by variations in process, voltage, or temperature on the integrated circuit to maintain the termination impedance of the fist transistor substantially constant; and
    a second feedback loop circuit coupled to a second resistor that matches the impedance of the second pull down transistor with an impedance of the second resistor and that compensates for changes in the impedance of the second pull down transistor that are caused by variations in process, voltage, or temperature on the integrated circuit to maintain the termination impedance of the second transistor substantially constant.

2. The integrated circuit of claim 1 further comprising:
    a third transistor coupled between a gate of the first transistor and a supply voltage;
    a pull up pre-diver;
    a fourth transistor coupled between the third transistor and the pull up pre-driver;
    a fifth transistor coupled between a gate of the second transistor and ground;
    a pull down pre-driver; and
    a sixth transistor coupled between the fifth transistor and the pull down pre-diver.

3. The integrated circuit of claim 1 wherein the first feedback loop includes a first amplifier, and the second feedback loop includes a second amplifier.

4. An integrated circuit comprising:
    a pull up transistor that provides series termination impedance to an input/output pin;
    a pull down transistor that provides series termination impedance to the input/output pin;
    a first feedback loop circuit that controls the impedance of the pull up transistor; and a second feedback loop circuit that controls the impedance of the pull down transistor, wherein the first feedback loop is coupled to a first external resistor, the first feedback loop matches an impedance of the pull up transistor with an impedance of the first external resistor, and the first feedback logo causes the pull up transistor to be insensitive to process, voltage, and temperature variations on the integrated circuit, and wherein the second feedback loop is coupled to a second external resistor, the second feedback loop reaches an impedance of the pull down transistor with an impedance of the second external resistor, and the second feedback loop causes the pull down transistor to be insensitive to process, voltage, and temperature variations an the integrated circuit.

5. An integrated circuit comprising:

a pull up transistor that provides series termination impedance to an input/output pin;

a pull down transistor that provides series termination impedance to the input-output pin;

a first feedback loop circuit that controls the impedance of the pull up transistor, wherein the first feedback loop comprises a first amplifier, a third transistor coupled to an output of the first amplifier, and a fourth transistor coupled to the transistor and a first input of the first amplifier;

a second feedback loop circuit that controls the impedance of the pull down transistor, wherein the second feedback loop comprises a second amplifier, a fifth transistor coupled to an output of the second amplifier, and a sixth transistor coupled to the fifth transistor and a first input of the second amplifier; and a resistor divider that is coupled to a second input of the first amplifier and a second input of the second amplifier.

6. The integrated circuit of claim 5 further comprising:

a seventh transistor coupled between a gate of the pull up transistor and a supply voltage;

a pull up driver;

an eighth transistor coupled between the seventh transistor and the pull up pre-driver;

ninth transistor coupled between the of the pull down transistor and ground;

a pull down pre-driver; and a tenth transistor coupled between the ninth transistor and the pull down pre-driver.

7. An integrated circuit comprising:

a first pull up transistor that provides series termination impedance to an input/output pin;

a second pull down transistor that provides series termination impedance to the input/output pin;

a first feedback loop circuit that compensates for changes in the impedance of the first pull up transistor that are caused by variations in process, voltage, or temperature on the integrated circuit to maintain the termination impedance of the first transistor substantially constant; and a second feedback loop circuit that compensates for chances in the impedance of the second pull down transistor that are caused by variations in process voltage or temperature on the integrated circuit to maintain the termination impedance of the second transistor substantially constant, wherein the first feedback loop circuit controls the impedance of a second pull up transistor that is coupled to a second input/output pin, and the second feedback loop circuit controls the impedance of a second pull down transistor coupled to the second input/output pin.

8. An integrated circuit comprising:

a fist transistor that is configured to be coupled to a first external resistor;

a first feedback loop coupled to the first transistor;

a first output driver circuit coupled to the first feedback loop and an input/output pin, the first output driver circuit having a second pull up transistor that provides termination resistance at the input/output pin, the first feedback loop matching an impedance of the second pull up transistor with an impedance of the first external resistor;

a third transistor that is configured to be coupled to a second external resistor;

a second feedback loop coupled to the third transistor; and a second output driver circuit coupled to the second feedback loop and the input/output pin, to second output driver circuit having a fourth pull down transistor that provides termination resistance at the input/output pin, the second feedback loop matching an impedance of the fourth pull down transistor with an impedance of the second external resistor.

9. The integrated circuit of claim 8, wherein the first feedback loop comprises:

a first amplifier coupled to the first transistor; and a fifth transistor coupled to the first amplifier and the first transistor.

10. The integrated circuit of claim 9 further comprising:

a resistor divider coupled to an input of the first amplifier.

11. The integrated circuit of claim 9 wherein the second feedback loop comprises:

a second amplifier coupled to the third transistor; and a sixth transistor coupled to the third transistor and the second amplifier.

12. The integrated circuit of claim 8 wherein:

the first output driver circuit further comprises a fifth transistor coupled between a supply voltage a gate of the second pull up transistor, a pull up driver, and a sixth transistor coupled to the pull up pre-driver, the fifth transistor, and the first feedback loop; and the second output driver circuit further comprises a seventh transistor coupled between ground and a gate of the fourth pull down transistor, a pull down pre-driver, and an eighth transistor coupled to the pull down pre-driver, the seventh transistor, and the second feedback loop.

13. The integrated circuit of claim 8, further comprising:

a third output driver circuit coupled to the first feedback loop and a second input/output pin, the third output driver circuit providing termination resistance at the second input/output pin; and a fourth output driver circuit coupled to the second feedback loop and the second input/output pin, the fourth output driver circuit providing termination resistance at the second input/output pin.

14. A method for providing termination impedance to a first input/output pin on an integrated circuit, the method comprising:

generating a first signal in remorse to the impedance of a first off chip circuit element;

adjusting the impedance of a first transistor in response to the first signal using a first feedback loop circuit that matches the impedance of first transistor with an impedance of the first off-chip circuit element;

generating a second signal in response to the impedance of a second off-chip circuit element; and adjusting the impedance of a second transistor in response to the second signal using a second feedback loop circuit that matches the impedance of the second transistor with an impedance of the second off-chip circuit element, the first and second transistors providing on-chip termination impedance to the first input/output pin.

15. The method of claim 14 wherein the first and second off-chip circuit elements are first and second resistors.

16. The method of claim 14 wherein adjusting the impedance of the first transistor in response to the first signal comprises:

amplifying the difference between the first signal and a reference value; and increasing the impedance of the first transistor in response to an increase in the impedance of the first off-chip circuit element.

17. The method of claim 16 wherein adjusting the impedance of the second transistor in response to the second signal comprises:

amplifying the difference between the second signal and the reference value; and increasing the impedance of the second transistor in response to an increase in the impedance of the second off-chip circuit element.

18. The method of claim 14 wherein adjusting the impedance of the first transistor in response to the first signal comprises coupling a third transistor between a supply voltage an gate of the first transistor, and coupling a fourth transistor to an output of the first feedback loop, the third transistor, and a pull up pre-diver; and wherein adjusting the impedance of the second transistor in response to the second signal comprises coupling a fifth transistor between ground and a gate of the second transistor, and coupling a sixth transistor to an output of the second feedback loop, the fifth transistor, and a pull down pre-driver.

19. The method of claim 14 wherein the first feedback loop comprises a first amplifier and a third transistor coupled to the first off-chip circuit element, and the second feedback loop comprises a second amplifier and a fourth transistor coupled to the second off-chip circuit element.

20. A method for providing termination impedance to a first signal pad on an integrated circuit, the method comprising:

monitoring an impedance of a first on-chip transistor;

matching an impedance of a second on-chip transistor with an impedance of a first resister coupled to the first on-chip transistor;

maintaining an impedance of the second on-chip transistor substantially constant in response to changes in the impedance of the first on-chip transistor that are caused by process, voltage, or temperature variations on the integrated circuit;

monitoring an impedance of a third on-chip transistor;

matching an impedance of a fourth on-chip transistor with an impedance of a second resister coupled to the third on-chip transistor; and maintaining an impedance of the fourth on-chip transistor substantially constant in response to changes in the impedance of the third on-chip transistor that are caused by process, voltage, or temperature variations on the integrated circuit, the second and the fourth transistors providing termination impedance to the first signal pad.

21. The method of claim 20 wherein maintaining the impedance of the second on-chip transistor substantially constant further comprises amplifying the first signal using a first amplifier, and maintaining the impedance of the fourth on-chip transistor substantially constant further comprises amplifying the second signal using a second amplifier.

22. The method of claim 21 wherein the first and second resisters are external resistors.

23. The method of claim 21 wherein amplifying the first signal using the first amplifier comprises coupling a first feedback loop circuit around the first on-chip transistor, and amplifying the second signal using the second amplifier comprises coupling a second feedback loop circuit around the third on-chip transistor.

24. The method of claim 21 wherein amplifying the first signal using the first amplifier comprises amplifying the difference between the first signal and a first reference voltage, and amplifying the second signal using the second amplifier comprises amplifying the difference between the second signal and the first reference voltage.

25. The method of claim 24 further comprising:

driving the voltage on the first signal pad HIGH using a pull up driver circuit; and driving the voltage on the first signal pad LOW using a pull down driver circuit.

26. The method of claim 20 further comprising:

maintaining the impedance of a fifth on-chip transistor substantially constant in response to the impedance of the first on-chip transistor; and maintaining the impedance of a sixth on-chip transistor substantially constant in response to the impedance of the third on-chip transistor, wherein the fifth and sixth transistors provide termination impedance to a second signal pad on the integrated circuit.

27. A method for providing termination impedance to a first pin on an integrated circuit, the method comprising:

monitoring the impedance of a first on-chip transistor;

varying the impedance of a second on-chip in response to changes in the impedance of the first transistor;

monitoring the impedance of a third on-chip transistor;

varying the impedance of a fourth on-chip transistor in response to changes in the impedance of the third transistor, the second and the fourth transistors providing termination impedance to the first pin;

coupling a first external resistor the first on-chip transistor;

coupling a second external resistor to the third on-chip transistor;

matching an impedance of the second on-chip transistor with an impedance of the first external resistor; and matching an impedance of the fourth on-chip transistor with an impedance of the second external resistor.

28. The method of claim 27 further comprising:

varying the impedance of a fifth on-chip transistor in response to changes in the impedance of the first transistor; and varying the impedance of a sixth on-chip transistor in response to changes in the impedance of the third transistor, the fifth and the sixth transistors providing termination impedance to a second pin on the integrated circuit.

29. A method for providing termination impedance to a first pin on an integrated circuit the method comprising:

monitoring an impedance of a first on-chip transistor;

matching an impedance of a second on-chip transistor with a impedance of a first resistor coupled to the first on-chip transistor;

varying an impedance of the second on-chip transistor in response to changes in the impedance of the first transistor by amplifying a first signal indicative of the impedance of the first on-chip transistor;

monitoring an impedance of a third on-chip transistor;

matching an impedance of a fourth on-chip transistor with an impedance of a second resistor coupled to the third on-chip transistor; and varying an impedance of the fourth on-chip transistor in response to changes in the impedance of the third transistor by amplifying a second signal indicative of the impedance of the third on-chip transistor, the second and the fourth transistors providing termination impedance to the first pin.

30. The method of claim 29 wherein amplifying the first signal further comprises coupling a first feedback loop circuit around the first on-chip transistor, and amplifying the second signal further comprises coupling a second feedback loop circuit around the third on-chip transistor.

* * * * *